United States Patent [19]

Volz et al.

[11] Patent Number: 4,659,378

[45] Date of Patent: Apr. 21, 1987

[54] SOLDERABLE ADHESIVE LAYER

[75] Inventors: Hans Volz, Schwieberdingen; Peter Kersten, Leonberg, both of Fed. Rep. of Germany

[73] Assignee: International Standard Electric Corporation, New York, N.Y.

[21] Appl. No.: 623,757

[22] Filed: Jun. 22, 1984

[30] Foreign Application Priority Data

Jun. 28, 1983 [DE] Fed. Rep. of Germany ....... 3323196

[51] Int. Cl.[4] .................... C22C 19/07; C22C 38/10; H01L 21/88; H01L 23/48
[52] U.S. Cl. ....................................... 420/8; 228/122; 228/123; 228/263.12; 228/263.13; 228/263.14; 420/435; 420/481; 420/117; 420/121
[58] Field of Search .................. 228/122, 123, 263.12, 228/263.13, 263.14; 420/435, 581; 75/123 R, 123 B, 123 L

[56] References Cited

U.S. PATENT DOCUMENTS

| 4,038,073 | 7/1977 | Handley et al. | 420/435 |
| 4,052,201 | 10/1977 | Polk et al. | |
| 4,059,217 | 11/1977 | Woodward | 228/263.13 |
| 4,221,592 | 9/1980 | Ray | 420/581 |
| 4,527,614 | 7/1985 | Matsumoto et al. | 164/463 |

FOREIGN PATENT DOCUMENTS

| 0011703 | 6/1980 | European Pat. Off. . |
| 1298711 | 6/1962 | France . |
| 487263 | 6/1938 | United Kingdom . |
| 1145948 | 3/1969 | United Kingdom . |
| 1556627 | 11/1979 | United Kingdom . |

Primary Examiner—James C. Cannon
Attorney, Agent, or Firm—Donald J. Lenkszus

[57] ABSTRACT

Electrical contacts to or mechanical connections between components and provided by using a thin layer of an alloy consisting of metals and metalloids. Such a layer shows excellent adhesion to glass or semiconductor substrates.

1 Claim, 3 Drawing Figures

SOLDERABLE ADHESIVE LAYER

BACKGROUND OF THE INVENTION

The present invention relates to a solderable adhesive layer. Such layers are needed mainly to make electrical contacts to or mechanical connections between components. They are particularly useful in making contacts to thin-film circuits deposited on semiconductor, glass or ceramic substrates.

To produce contact areas and interconnections in thin-film circuits, layers of copper, gold, or aluminum are commonly deposited in a vacuum. Such layers have the advantage of very high conductivity, but they have the disadvantage of not adhering well to the base, so that special precautions have to be taken during soldering.

SUMMARY OF THE INVENTION

The object of the invention is to provide a layer which, on the one hand, is easily solderable and, on the other hand, adheres well to the base, mostly glass or semiconductor material.

According to the invention, the layer is a thin layer of an alloy consisting of metals and metalloids.

The layer according to the invention has an added advantage in that it can be much thinner than conventional layers. A thickness of about 100 Å will be sufficient, while a copper layer must be about 3 $\mu$m thick. For special applications, it may be of importance that the layer according to the invention also has magnetic properties, so that magnetic sensors, together with their terminals, can be manufactured in a single operation. For some applications, it may be of importance that commonly used solders and the layer, while combining very well, do not dissolve in each other and, thus, can be separated again residue-free, while in conventional soldered joints, inseparable alloys are formed between the solder and the joint.

BRIEF DESCRIPTION OF THE DRAWINGS

Embodiments of the invention will now be explained in more detail with reference to the accompanying drawing, in which.

DETAILED DESCRIPTION OF THE DRAWINGS

Readily solderable and, above all, very well adhering contact layers for thin-film circuits are formed by depositing thin layers of an alloy consisting of metals and metalloids by evaporation or sputtering. The adhesion of such a layer to the base will be quite sufficient if the layer is deposited by evaporation. However, because of the simplicity of the process, not because of the even better result, sputtering will be preferred. The metals cobalt and iron and the metalloids boron, silicon, and germanium proved to be well suited. The proportion of the metals should be approximately 60 to 90, preferably 80 at .%. Especially well suited are alloys consisting of cobalt and boron and alloys consisting of cobalt, iron, and boron, such as $Co_xFe_yB_{100-x-y}$ where $70 \leq x \leq 80$ and $4 \leq y \leq 10$ (x and y in at .%).

Figure 1:
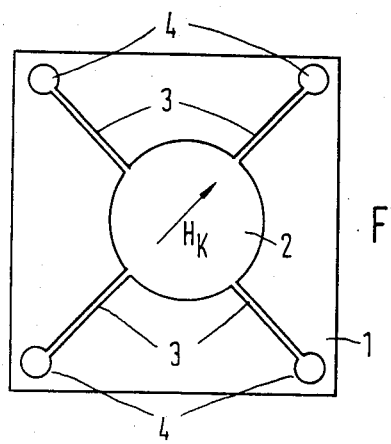
FIG. 1 is a top view of a magnetic sensor deposited on a glass substrate and having four leads and four solder pads.

FIG. 1 shows a glass substrate 1 which supports a magnetic sensor together with its connections. The sensor 2 is a circular area. It has four radially outwardly extending leads 3, which are spaced at 90° intervals. At its outer end, each of the leads 3 has a solder pad 4. The sensor 2, together with its leads 3 and the solder pads 4, is formed by depositing a thin layer of an amorphous metal, $Co_{75}Fe_5B_{20}$, in a single operation. During the deposition of the layer, the glass substrate 1 is in a magnetic field whose direction is parallel to either of the two lead pairs. It thus shows magnetic anistropy, which can be described by an anisotropic field $H_k$. If a current is sent through the sensor 2 parallel to $H_k$, and the sensor is placed in a magnetic field perpendicular to $H_k$ in the plane of the of the sensor, a voltage from which the magnitude of the applied magnetic field is determinable can be taken off in the direction perpendicular to $H_k$. In the case of especially long leads 3, the latter may be of a different material, such as aluminium. The sensor 2 and the solder pads 4, on the one hand, and the leads 3, on the other hand, must then be produced in separate operations.

Figure 2:
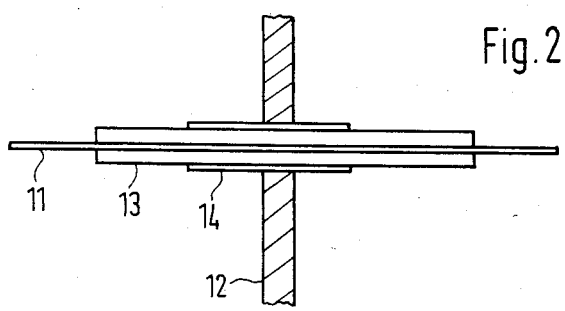
FIG. 2 is a sectional view of a feedthrough insulator for bringing a conductor inside a vacuum vessel.

FIG. 2 shows a conductor 11 fed through a "vacuum flange" 12. In the area of the vacuum flange 12, the conductor 11 (of platinum, for example) is sealed in a glass envelope 13 having a solder layer 14 on its outside. According to the invention, the solder layer is an alloy consisting of about 80 at .% of cobalt and 20 at .% of boron. The vacuum flange 12 is soldered to the solder layer 14, so that a feedthrough insulator for a vacuum vessel is obtained.

Figure 3:
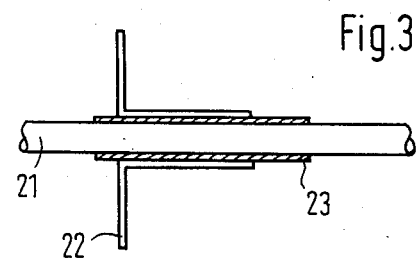
FIG. 3 is a sectional view of a glass-fiber mounting.

On the same principle, a glass fiber can be mounted, a shown in FIG. 3. A glass fiber 21 is provided with a soldering layer 23 of CoB in the area of a soldering sleeve 22. The soldering layer 23 and the soldering sleeve 22 are soldered together.

What is claimed is:

1. A solderable adhesive layer comprising a thin layer of an alloy consisting of a metal selected from the group of cobalt, iron or a combination thereof, and a metalloid, said metalloid being germanium.

* * * * *